US010122139B1

(12) United States Patent
Struyk et al.

(10) Patent No.: US 10,122,139 B1
(45) Date of Patent: Nov. 6, 2018

(54) ADAPTER APPARATUS WITH CONDUCTIVE ELEMENTS MOUNTED USING LAMINATE LAYER AND METHODS REGARDING SAME

(71) Applicant: IRONWOOD ELECTRONICS, INC., Eagan, MN (US)

(72) Inventors: David Allen Struyk, Deephaven, MN (US); Kenneth Irving Krawza, Prior Lake, MN (US); Ilavarasan M. Palaniappa, Inver Grove Heights, MN (US); Sultan Mahmood Faiz, St. Paul, MN (US)

(73) Assignee: IRONWOOD ELECTRONICS, INC., Eagan, MN (US)

( * ) Notice: Subject to any disclaimer, the term of this patent is extended or adjusted under 35 U.S.C. 154(b) by 0 days.

(21) Appl. No.: 15/834,479

(22) Filed: Dec. 7, 2017

(51) Int. Cl.
| *H01R 12/57* | (2011.01) |
| *H01R 31/06* | (2006.01) |
| *H01R 12/70* | (2011.01) |
| *H01R 12/52* | (2011.01) |
| *H01R 13/405* | (2006.01) |

(52) U.S. Cl.
CPC .............. *H01R 31/06* (2013.01); *H01R 12/52* (2013.01); *H01R 12/7076* (2013.01); *H01R 13/405* (2013.01); *H01R 2201/20* (2013.01)

(58) Field of Classification Search
CPC .................... H01R 12/57; H01R 12/58; H01L 2924/01078; H01L 2924/01079; H05K 1/0306; H05K 1/182

USPC ............. 439/83, 876; 29/842, 846; 174/256; 361/761

See application file for complete search history.

(56) References Cited

U.S. PATENT DOCUMENTS

| 3,865,455 A | * | 2/1975 | Berg ................... H05K 3/3447 |
| | | | 174/263 |
| 3,971,610 A | | 7/1976 | Buchoff et al. |
| 4,070,077 A | | 1/1978 | Clark |
| 4,341,433 A | | 7/1982 | Cherian et al. |
| 4,393,438 A | | 7/1983 | Schelhorn |
| 4,421,368 A | | 12/1983 | Saban |
| 4,586,607 A | | 5/1986 | Dubbs et al. |
| 4,750,889 A | * | 6/1988 | Ignasiak .............. H05K 3/0094 |
| | | | 228/180.1 |
| 5,076,794 A | | 12/1991 | Ganthier |
| 5,249,975 A | * | 10/1993 | Baderschneider ..... H01R 43/24 |
| | | | 439/83 |
| 5,418,471 A | | 5/1995 | Kardos |
| 5,691,041 A | | 11/1997 | Frankeny et al. |
| 5,702,255 A | | 12/1997 | Murphy et al. |
| 5,712,768 A | | 1/1998 | Werther |
| 5,742,481 A | * | 4/1998 | Murphy ............... H01R 43/205 |
| | | | 361/767 |
| 5,770,891 A | | 6/1998 | Frankeny et al. |
| 5,810,607 A | | 9/1998 | Shih et al. |
| 5,876,219 A | | 3/1999 | Taylor et al. |
| 5,892,245 A | | 4/1999 | Hilton |

(Continued)

*Primary Examiner* — Gary Paumen
(74) *Attorney, Agent, or Firm* — Mueting, Raasch & Gebhardt, P.A.

(57) ABSTRACT

An adapter apparatus and methods for using in providing such adapter apparatus include providing a substrate having a plurality of openings defined therethrough. A plurality of conductive elements are mounted within corresponding openings thereof using a flowable and curable laminate material.

22 Claims, 13 Drawing Sheets

(56) References Cited

U.S. PATENT DOCUMENTS

| | | | |
|---|---|---|---|
| 6,007,348 | A | 12/1999 | Murphy |
| 6,325,280 | B1 | 12/2001 | Murphy |
| 6,352,437 | B1 | 3/2002 | Tate |
| 6,409,521 | B1 | 6/2002 | Rathburn |
| 6,764,313 | B2 | 7/2004 | Hougham |
| 6,981,879 | B2 | 1/2006 | Kuczynski et al. |
| 7,094,069 | B1 | 8/2006 | Saydam et al. |
| 8,091,222 | B2 | 1/2012 | Fedde et al. |
| 2005/0196979 | A1 | 9/2005 | Fedde et al. |
| 2016/0141775 | A1* | 5/2016 | Loibl ................ H01R 13/5219 439/83 |

* cited by examiner

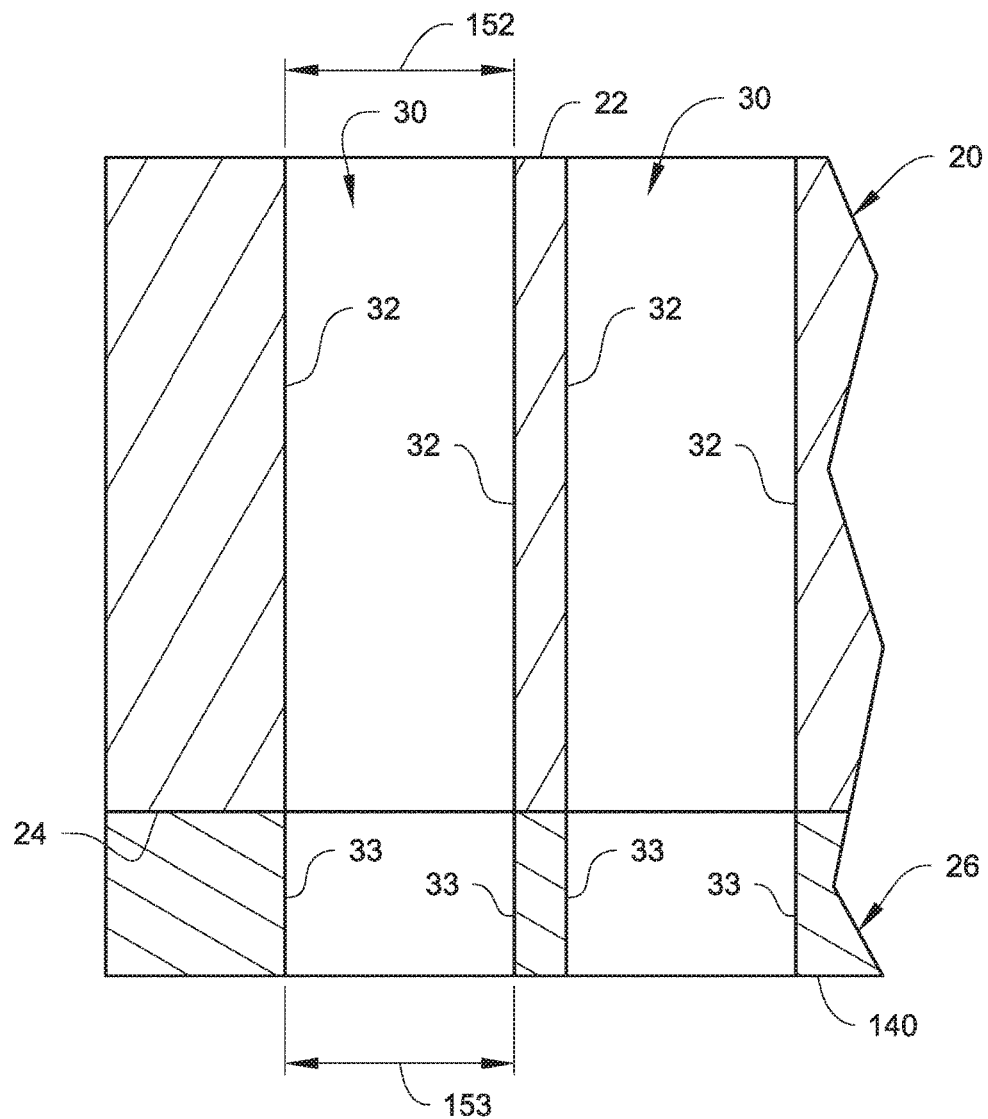

ADAPTER APPARATUS WITH CONDUCTIVE ELEMENTS MOUNTED USING LAMINATE LAYER AND METHODS REGARDING SAME

BACKGROUND OF THE INVENTION

The present disclosure relates generally to adapters for use with packaged devices or other adapter apparatus (e.g., ball grid array (BGA) packages, land grid array or other surface mount devices, male pin adapters, female socket adapter apparatus, etc.).

Certain types of integrated circuit packages are becoming increasingly popular due to their occupancy area efficiency. In other words, they occupy less area on a target board on which they are mounted while providing a high density of contact terminals. For example, one such high density package type is a ball grid array package.

Generally, ball grid array packages contain an integrated circuit having its die bond pads electrically connected to respective conductive solder spheres that are distributed on the bottom surface of the package in an array. A target printed circuit board typically has formed on its surface a corresponding array of conductive pads which align with the array of solder spheres for electrically mounting the ball grid array package on the target board.

The target board typically includes other conductive traces and elements which lead from the array of conductive pads used for mounting the ball grid array package to other circuitry on the board for connecting various components mounted thereon. Typically, to mount such a ball grid array package to a target board, the package is positioned with the array of solder spheres corresponding to the array of conductive pads on the target board. The resulting structure is then heated until the solder spheres are melted and fused to the conductive pads of the target board.

Such area efficient packaging (e.g., ball grid array packages) provide a high density of terminals at a very low cost. Also, this packaging provides for limited lead lengths. Limited lead lengths may reduce the risk of damage to such leads of the package, may provide for higher speed product, etc.

Generally, circuit boards and/or components mounted thereon are tested by designers as the circuit boards are being developed. For example, for a designer to test a circuit board and/or a ball grid array package mounted thereon, the designer must first electrically connect the solder spheres on the ball grid array package to the target circuit board. As described above, this generally includes mounting the ball grid array package on the target board and heating the solder spheres to fuse the solder spheres to the conductive pads of the target board. Therefore, the package may be prevented from being used again. It is desirable for various reasons to use package adapters for mounting the packages and reuse ball grid array packages after testing. For example, such ball grid array packages may be relatively expensive. Further, for example, once attached, the solder spheres are not accessible for testing. In addition, it is often difficult to rework the circuit board with packages soldered thereon.

Various adapters which are used for electrically connecting the ball grid array package to a target printed circuit board are known. For example, U.S. Pat. No. 6,007,348 to Murphy, issued 28 Dec. 1999, entitled "Solder Sphere Terminal," and U.S. Pat. No. 6,325,280 to Murphy, issued 4 Dec. 2001, entitled "Solder Sphere Terminal," describe several adapter apparatus for use in mounting ball grid array packages. For example, as described therein, various intercoupling components are provided. In one of such components, an insulative support member includes a plurality of terminal elements positioned within holes extending through the insulative support member. The terminal elements are sized to be press-fit within the holes of the insulative support member.

However, in many circumstances, substrates which have terminals that are merely press-fit within openings defined therethrough (e.g., when press-fitting a female socket pin into openings of an adapter substrate) require the need for multiple hole sizes to be formed to permit the press-fit to effectively hold the terminal in place. The hole sizes in the substrate generally require tight control in dimension to make sure that solder does not migrate up or along the terminal (e.g., socket pin) during processing. Such a tightly controlled dimensional substrate is relatively expensive to manufacture. Still further, the use of press-fit terminals also yields problems due to the difficulty of controlling a drilling process for forming the openings, if drilling is used to form such openings in the adapter substrate. Still further, other adapters which may be used for electrically connecting the ball grid array package to a target printed circuit board are known. For example, U.S. Pat. No. 8,091,222 to Fedde et al., issued 10 Jan. 2012, entitled "Method for Forming an Adapter Apparatus Using Curable Material" and U.S. Pat. No. 7,094,069 to Saydam et al., issued 22 Aug. 2006, entitled "Seal Member Limiting Solder Flow" describe adapter apparatus for use in mounting ball grid array packages.

SUMMARY OF THE INVENTION

To eliminate problems associated with conventional adapters, the present subject matter uses laminate material to mount conductive elements (e.g., female socket pins, male terminal pins, etc.)

In one or more embodiments of an adapter apparatus, the adapter apparatus may include a substrate having a surface, a laminate material applied to the surface of the substrate, a plurality of openings defined through the substrate and the laminate material applied thereto, and a plurality of conductive elements. Each conductive element is mounted within a corresponding opening of the plurality of openings using the laminate material (e.g., each conductive element includes an end configured to receive solder material thereon). The laminate material may be flowed and cured to form a fillet seal of laminate material about a perimeter of the end of each conductive element bridging a gap between the conductive element and one or more surfaces defining the opening through the substrate in which the conductive element is mounted.

In one or more embodiments of the adapter apparatus, the laminate material may be integral with and continuous on the surface of the substrate between the fillet seals formed about the perimeters of the ends of the conductive elements.

In one or more embodiments of the adapter apparatus, at least one of the plurality of conductive elements may include a main body portion and a tail portion extending therefrom terminating at the end of the conductive element. The tail portion may extend at least partially within the corresponding opening and outside of the corresponding opening beyond a surface of the laminate material applied to the surface of the substrate prior to the laminate material being flowed and cured to form the fillet seal of laminate material about the perimeter of the end of the conductive element bridging the gap between the conductive element and one or more surfaces defining the corresponding opening.

In one or more embodiments of the adapter apparatus, the main body portion may terminate at an end opposite of the end terminating the tail portion (e.g., wherein the end terminating the tail portion may be accessible for receiving solder material and the end terminating the main body portion of the conductive element may be accessible when the at least one conductive element is mounted in the corresponding opening). The fillet seal bridging the gap between the conductive element and one or more surfaces defining the corresponding opening through the substrate in which the conductive element is mounted may include laminate material flowed and cured in a region between the tail portion and one or more surfaces defining the corresponding opening to block entry of other material into the corresponding opening.

Further, in one or more embodiments of the adapter apparatus, at least one of the plurality of conductive elements may include an outer surface, wherein a portion of the outer surface may be contacted with the laminate material applied to the surface of the substrate when flowed and cured to form the fillet seals.

One or more embodiments of a method for use in forming an adapter apparatus may include providing a substrate and a sheet of laminate material applied on a surface of the substrate, defining a plurality of openings through the substrate and the sheet of laminate material applied thereto (e.g., wherein each of the plurality of the openings may be configured to receive one of a plurality of conductive elements, and wherein each of the plurality of conductive elements may include an end configured to receive solder material thereon), inserting each of the plurality of conductive elements into a corresponding opening of the plurality of the openings, and flowing and curing the sheet of laminate material to form a seal of laminate material about a perimeter of the end of each conductive element bridging a gap between the conductive element and one or more surfaces defining the opening through the substrate in which the conductive element is inserted.

One or more embodiments of the method may further include applying heat and pressure to affix the sheet of laminate material to the surface of the substrate; or may include using a solvent and a roller to affix the sheet of laminate material to the surface of the substrate.

In one or more embodiments of the method, defining each of the plurality of openings through the substrate and the sheet of laminate material applied thereto may include creating a substrate opening through the substrate having a substrate opening diameter and creating a laminate sheet opening through the laminate sheet applied to the substrate having a laminate opening diameter. Further, for example, creating a laminate sheet opening through the laminate sheet applied to the substrate may include decreasing a size of at least a portion of the laminate sheet opening such that the laminate opening diameter of the portion is less than the substrate opening diameter.

Further, in one or more embodiments of the method, defining each of the plurality of openings through the substrate and the sheet of laminate material applied thereto may include creating a substrate opening through the substrate having a substrate opening diameter and creating a laminate sheet opening through the laminate sheet applied to the substrate having a laminate opening diameter; and further the method may include deforming the laminate sheet applied to the surface of the substrate with the laminate sheet openings defined therein to decrease the size of at least a portion of the laminate sheet openings such that the laminate opening diameter of the portion of the laminate sheet openings are less than the substrate opening diameter of the substrate openings. For example, deforming the laminate sheet applied to the surface of the substrate with the laminate sheet openings defined therein to decrease the size of at least a portion of the laminate sheet openings may include applying heat and pressure to the laminate sheet to decrease the size of the portion of the laminate sheet openings.

Still further, in one or more embodiments of the method, applying the sheet of laminate material to the surface of the substrate may result in an exposed surface of the sheet of laminate material, and inserting each of the plurality of conductive elements into a corresponding opening of the plurality of the openings may include inserting each of the plurality of conductive elements into a corresponding opening of the plurality of the openings such that an end surface terminating the end of the conductive element is outside of the corresponding opening beyond the exposed surface of the sheet of laminate material. For example, in such a configuration, flowing and curing the sheet of laminate material to form a seal of laminate material about a perimeter of the end of each conductive element bridging a gap between the conductive element and one or more surfaces defining the opening through the substrate in which the conductive element is inserted may include forming a meniscus between the end surface terminating the end of each conductive element and laminate material continuously affixed to the surface of the substrate between the conductive elements.

Yet further, in one or more embodiments of the method, each of the plurality of conductive elements may include a main body portion and a tail portion extending therefrom terminating at the end surface of the conductive element (e.g., wherein the tail portion may extend at least partially within the corresponding opening and outside of the corresponding opening beyond the exposed surface of the sheet of laminate material). In such a configuration, for example, flowing and curing the sheet of laminate material to form a seal of laminate material about a perimeter of the end of each conductive element bridging a gap between the conductive element and one or more surfaces defining the opening through the substrate in which the conductive element is inserted may include forming a meniscus between the end surface terminating the end of each conductive element and laminate material continuously affixed to the surface of the substrate between the conductive elements as laminate material wicks up the tail portion of the conductive element outside of the corresponding opening beyond the exposed surface of the sheet of laminate material.

Yet further, in one or more embodiments of the method, at least one of the plurality of conductive elements may include an outer surface, wherein a portion of the outer surface may be contacted with laminate material after flowing and curing the sheet of laminate material to form a fillet seal of laminate material that may include a concave ring of laminate material bridging a gap between the conductive element and one or more surfaces defining the opening through the substrate in which the conductive element is inserted.

In one or more embodiments of another method for use in forming an adapter apparatus, the method may include providing a substrate, providing a dry flowable sheet of laminate material, affixing the sheet of laminate material to a surface of the substrate resulting in an exposed surface of the sheet of laminate material, defining a plurality of openings through the substrate and the sheet of laminate material affixed thereto (e.g., wherein each of the plurality of the openings may be configured to receive one of a plurality of conductive elements), inserting each of the plurality of conductive elements into a corresponding opening of the plurality of the openings such that a portion of the conductive element and an end surface terminating the end of the conductive element is outside of the corresponding opening beyond the exposed surface of the sheet of laminate material, and reflowing and curing the dry flowable sheet of laminate material to form a meniscus about the perimeter of each conductive element and between an end surface terminating an end of each conductive element and laminate material continuously affixed to the surface of the substrate between the conductive elements as laminate material wicks up the portion of the conductive element outside of the corresponding opening beyond the exposed surface of the sheet of laminate material.

Yet further, in one or more embodiments of the adapter apparatus or methods, at least one of the plurality of conductive elements may include a female socket pin, a male terminal pin, or a conductive element comprising two ends configured to receive solder material on at least one of the ends. Still further, in one or more embodiments of the adapter apparatus or methods, the adapter apparatus may include a plurality of solder balls, wherein each solder ball is attached to the end of a corresponding conductive element of the plurality of conductive elements. Even further, in one or more embodiments of the adapter apparatus or methods, the plurality of conductive elements may be mounted in the plurality of openings configured to correspond to a contact element pattern of a surface mount device.

The above summary of the present disclosure is not intended to describe each embodiment or every implementation of the present subject matter. Advantages, together with a more complete understanding of the disclosure, will become apparent and appreciated by referring to the following detailed description and claims taken in conjunction with the accompanying drawings.

BRIEF DESCRIPTION OF THE DRAWINGS

FIGS. 4A-4G show exemplary process embodiments for use in describing the one or more embodiments of the method shown generally in FIG. 3.

DETAILED DESCRIPTION OF THE EMBODIMENTS

Figure 1A:
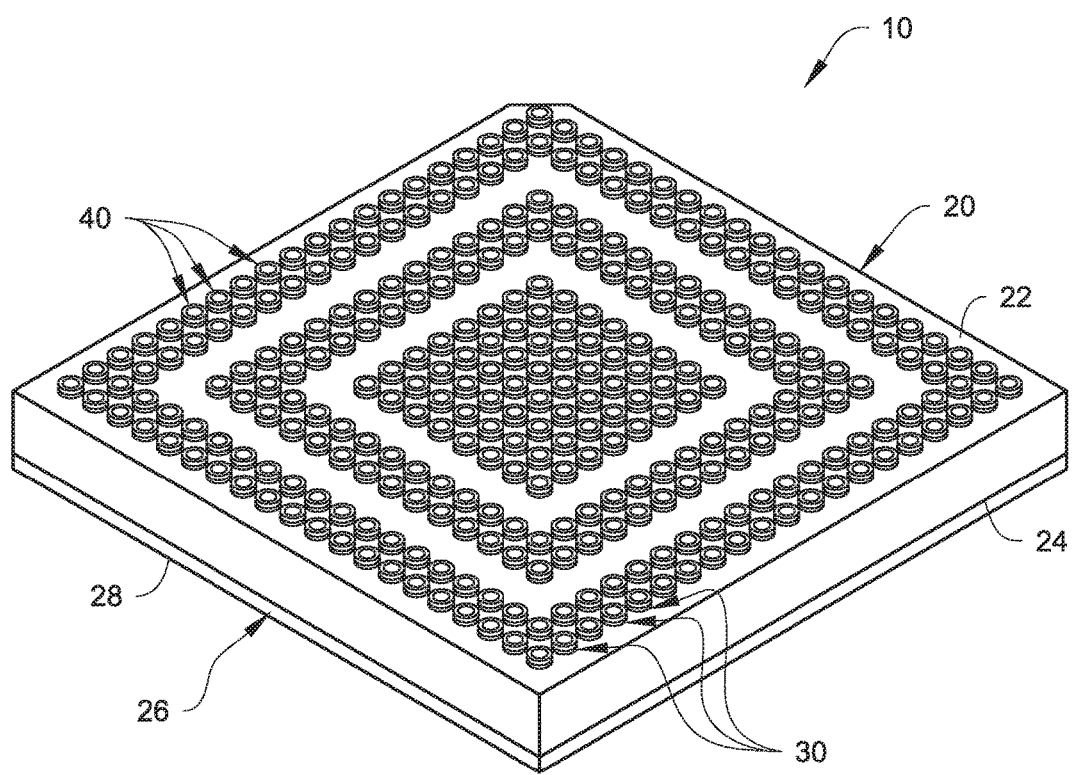
FIGS. 1A-1E show a top perspective view, a bottom perspective view, a top plan view, a bottom plan view, and a side view, respectively, of one exemplary embodiment of an adapter apparatus according to the present disclosure.

The present disclosure shall generally be described with reference to FIGS. 1-4. It will be apparent to one skilled in the art that elements from one embodiment may be used in combination with elements of the other embodiments, and that the present invention is not limited to the specific embodiments described. Further, it will be recognized that the embodiments of the present disclosure described herein will include many elements that are not necessarily shown to scale. Further, it will be recognized that the size and shape of various elements herein may be modified without departing from the scope of the present disclosure, although one or more shapes and sizes may be advantageous over others.

FIGS. 1A-1E show a top perspective view, a bottom perspective view, a top plan view, a bottom plan view, and a side view, respectively, of an exemplary embodiment of an adapter apparatus 10 according to the present disclosure. The adapter apparatus 10 includes a substrate 20 including a first surface 22 and a second surface 24 spaced apart therefrom. A laminate material 26 is applied (e.g., affixed to, such as by lamination) to the second surface 24 of the substrate 20. The laminate material 26 applied to the substrate 20 (e.g., after reflow and curing as described herein) results in a surface 28 of the laminate material opposite the first surface 22 of the substrate 20.

Figure 1B:
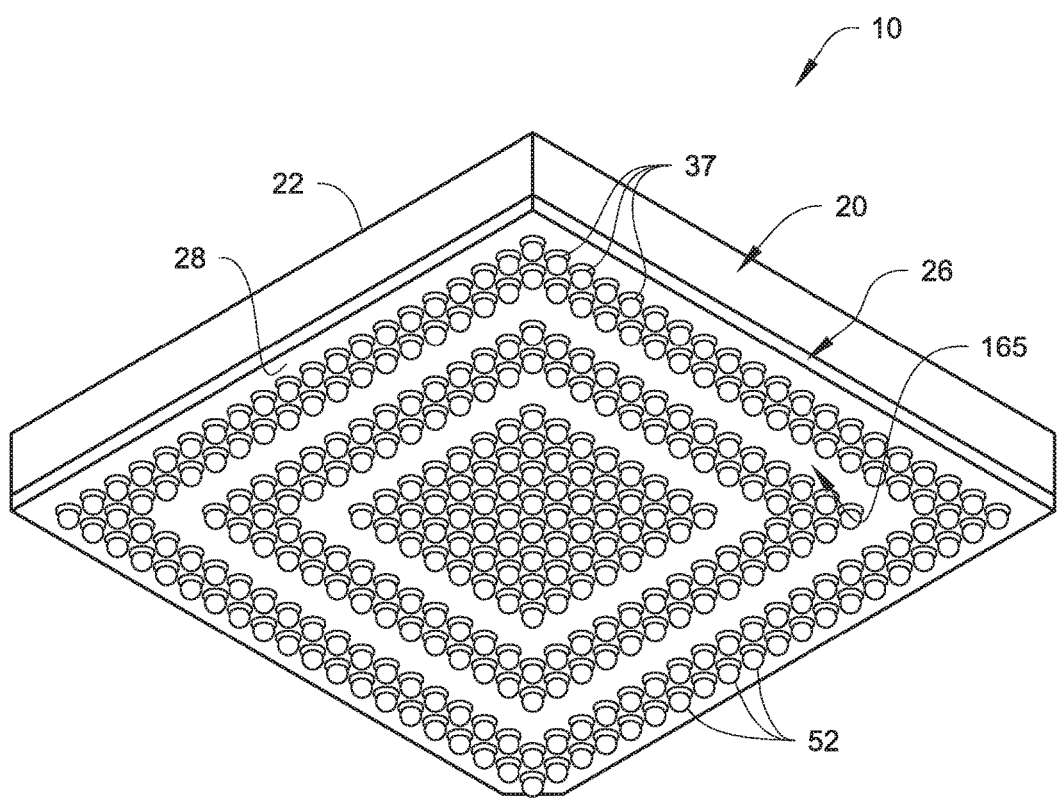
Figure 1C:
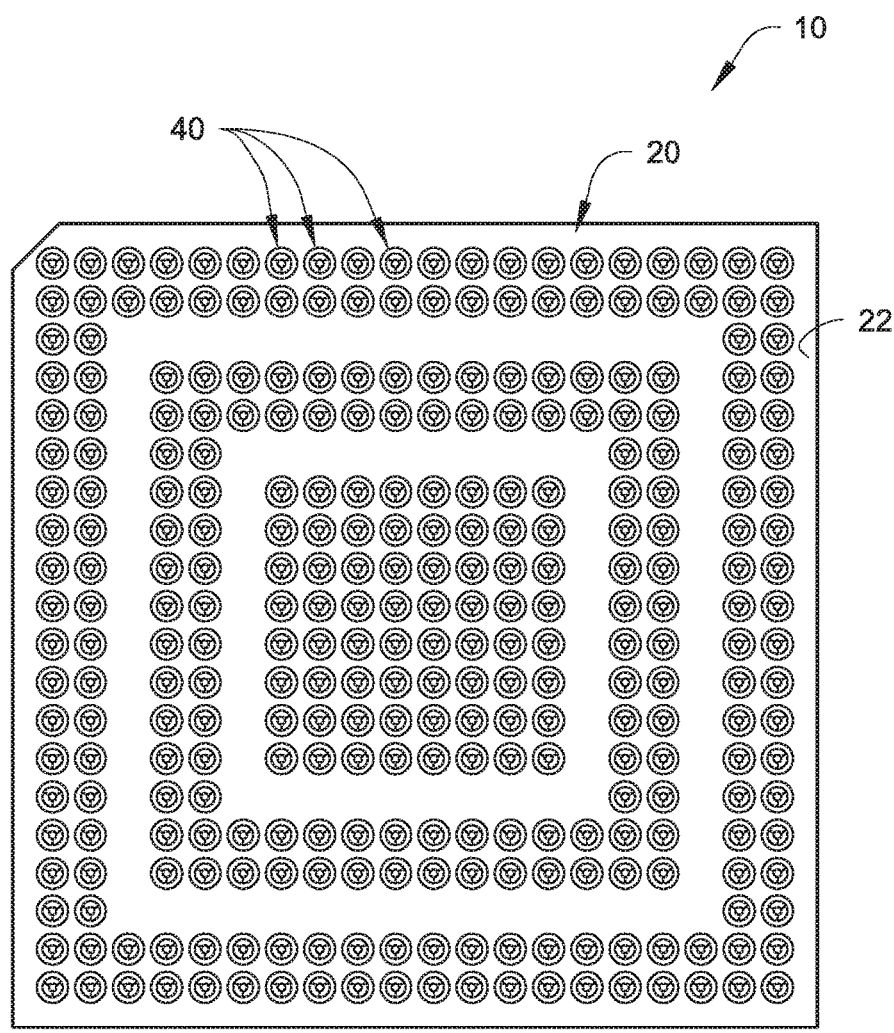
Figure 1D:
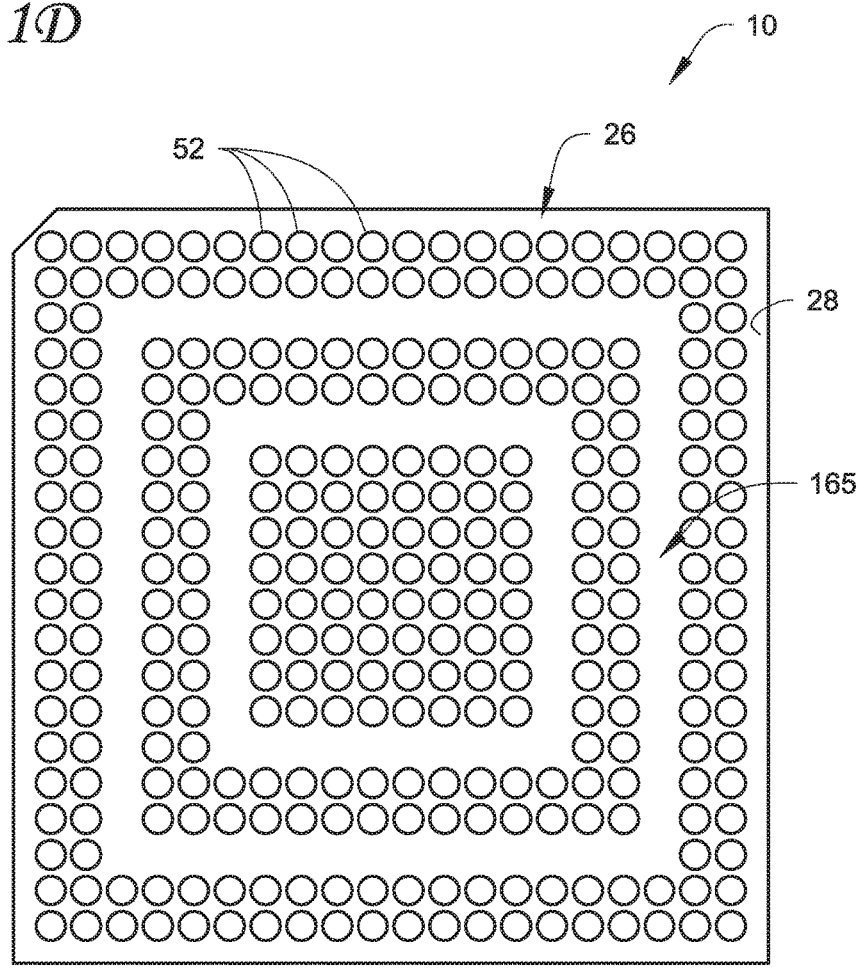
Figure 1E:
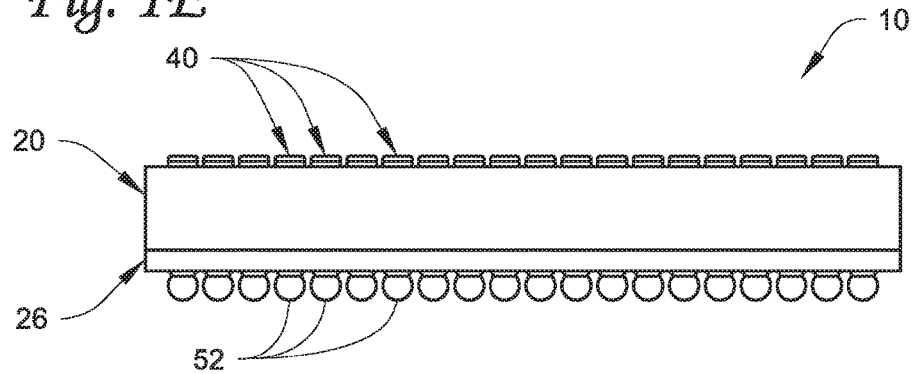

The adapter apparatus 10 further includes conductive elements 40 mounted within openings 30 defined through substrate 20 and the laminate material 26 applied thereto. The conductive elements 40 are mounted within the openings 30 using the laminate material 26 as shown in further detail in the cross sectional detail views of FIGS. 2A-2B and as described with reference to the process diagrams of FIG. 3 and FIGS. 4A-4G. Solder balls 52 are secured on end surfaces 37 at first ends 44 of the conductive elements 40 such as shown in FIGS. 1B and 1D-1E.

Figure 2A:
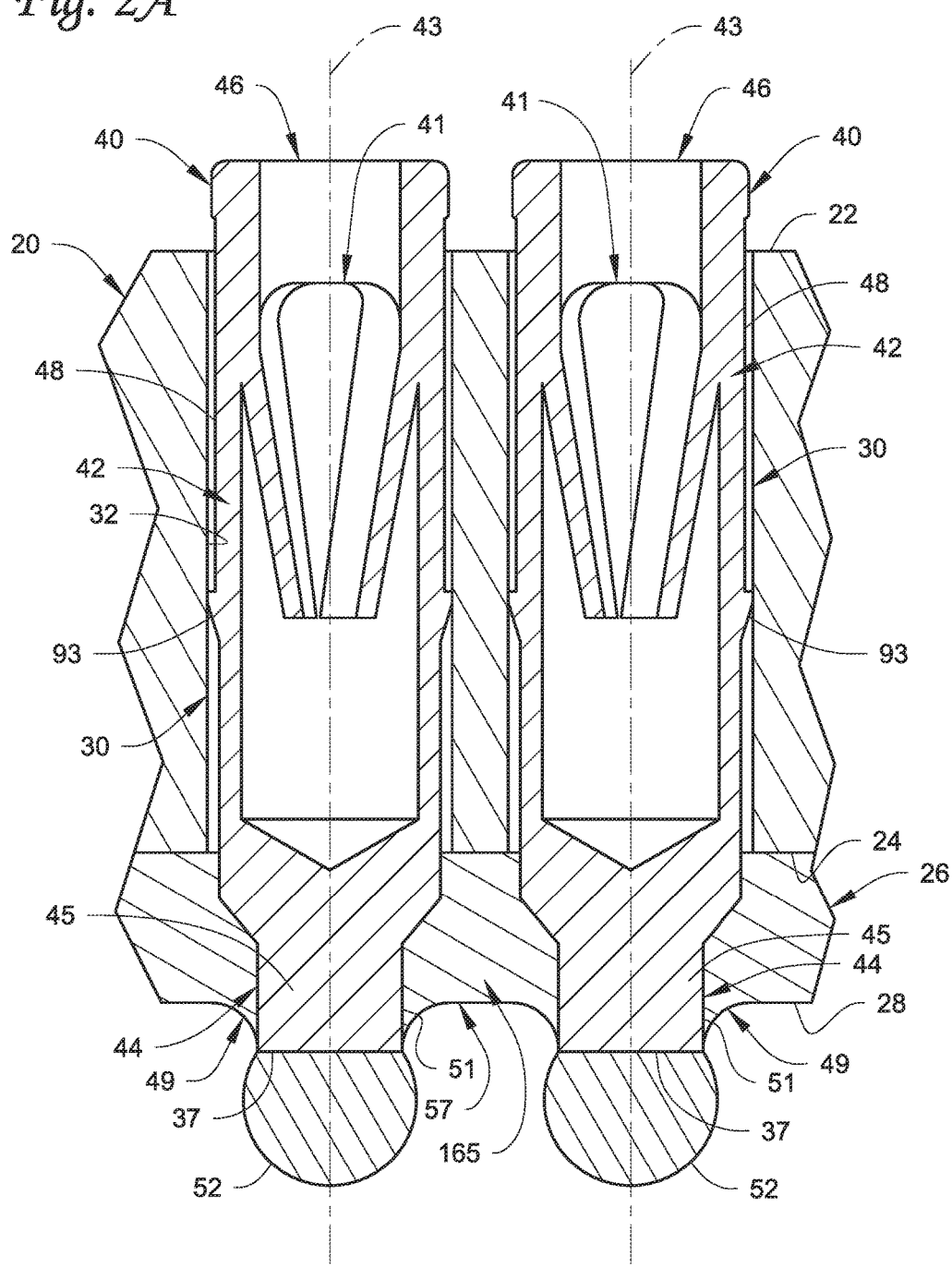
FIG. 2A is a generalized illustrative diagram of one exemplary embodiment of a portion of an adapter apparatus such as shown in FIGS. 1A-1E according to the present disclosure for use in mounting a packaged device relative to a target board.
Figure 2B:
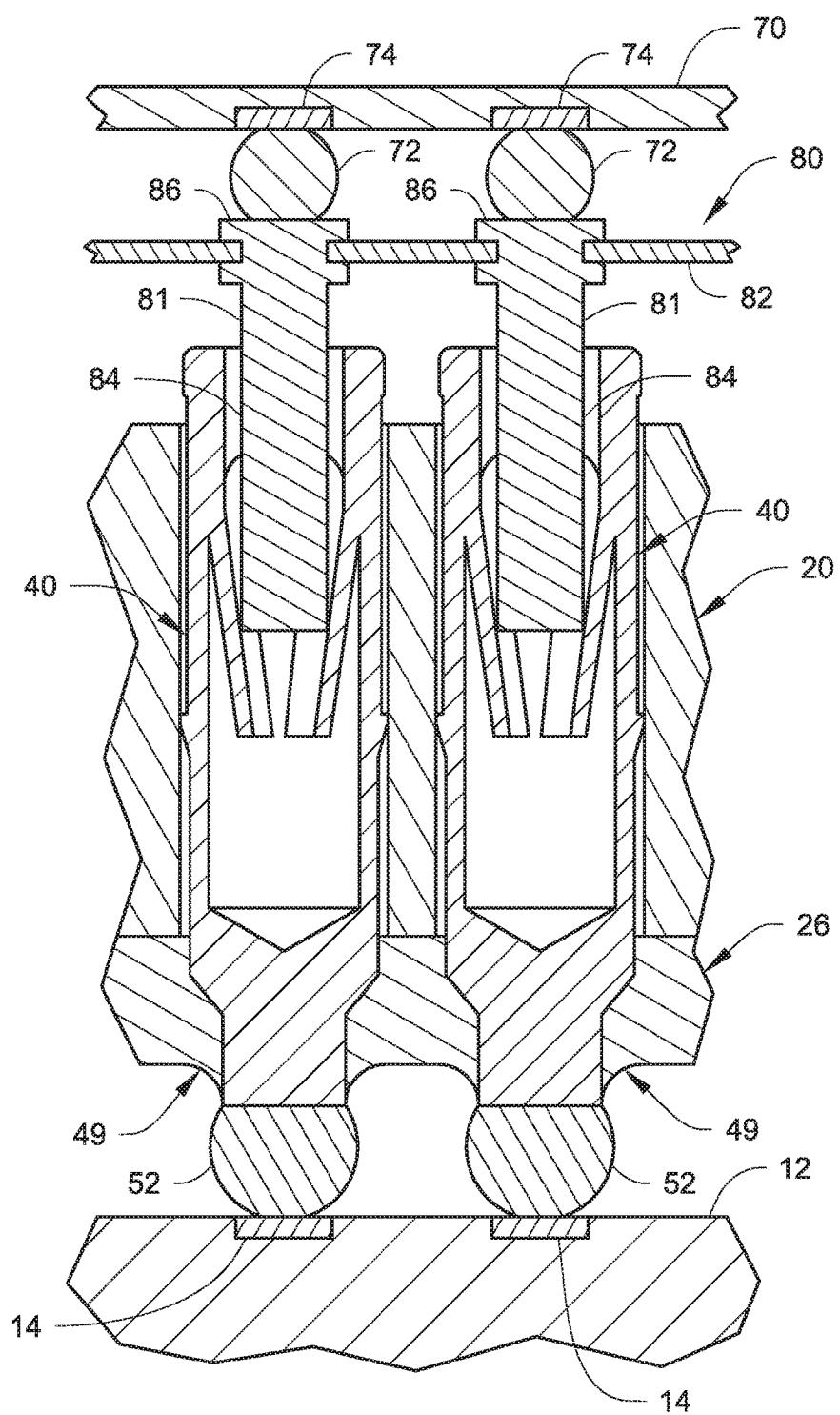
FIG. 2B is a generalized diagrammatic view of a portion of the adapter apparatus such as shown in FIG. 2A which illustrates the adapter apparatus mounting a packaged device relative to a target board.

FIG. 2A is a generalized illustrative diagram of one exemplary embodiment of a portion of the adapter apparatus 10 such as shown in FIGS. 1A-1E for use in mounting a packaged device relative to a target board (e.g., as shown in FIG. 2B). FIG. 2B is a generalized diagrammatic view of a portion of the adapter apparatus 10 such as shown in FIG. 2A but which illustrates the adapter apparatus mounting a packaged device 70 relative to a target board 12.

As shown in FIG. 2A, the adapter apparatus 10 includes the substrate 20. Substrate 20 comprises a body of material extending between a first surface 22 and a second surface 24. In one embodiment of substrate 20, the first surface 22 and the second surface 24 are planar surfaces that generally lie parallel to one another. The laminate material 26 is applied (e.g., affixed to, such as by lamination) to the second surface 24 of the substrate 20. The laminate material 26 applied to the substrate 20 (e.g., after flow and curing as described herein) results in the surface 28 of the laminate material opposite the first surface 22 of the substrate 20 (e.g., the surface 28 being the exposed surface of a fillet seal 49 created during flow and curing of the laminate material 26, and the exposed surface of the laminate material 165 integral with and located between the fillet seals 49 created about the multiple conductive elements 40, such as in region 57).

The substrate 20 may be formed of any suitable insulative material (e.g., polyimide materials). Preferably, substrate 20 is formed of a high temperature material (e.g., a material that is suitable for use in temperatures that exceed 125 degrees Centigrade). For example, the substrate 20 may be formed of one or more materials such as FR4, G10, Kapton, or Rogers R04350. Further, any number of materials or layers may be used to form the substrate 20.

In one or more embodiments, the substrate 20 may be of a size generally equivalent to a packaged device (e.g., packaged device 70) which is to be mounted using the adapter apparatus 10. However, one skilled in the art will recognize that the size and shape of the substrate material 20 may vary based on the application of the adapter apparatus (e.g., the adapter apparatus may be configured to mount more than one packaged device).

The present adapter may be used to mount various types of packaged devices, including, but not limited to, for example, surface mount devices, such as ball grid array packages, land grid array packages, micro lead frame (MLF) devices, column grid array packages, non-solder ball packages, other packaged devices with surface mount pads, etc. One will recognize that the configuration of the adapter apparatus may be different depending on the type of the packaged device being mounted (e.g., the apparatus being different or the same for a package including solder balls versus a non-solder ball package).

The laminate material 26 applied to the substrate 20 may be formed of any suitable flowable and curable material (e.g., laminate materials). For example, the laminate material 26 may include a laminate material provided as a dry flowable material, such as a sheet of laminate material that may be applied to the surface 24. For example, the laminate material may be a heat flowable and curable layer of material.

In one or more embodiments, the laminate material 26 may be applied (e.g., as a sheet of material) to the surface 24 of the substrate 20 using heat and pressure. In one or more embodiments, the laminate material 26 may be applied (e.g., as a sheet of material) to the surface 24 of the substrate 20 using a solvent and pressure (e.g., a cold roller). In one or more embodiments, the laminate material 26 may be any suitable flowable and curable material that may be applied to the surface 24 (e.g., permanently affixed) by one of heat, pressure, welding, solvents, adhesives, spray, extrusion, or the like. Generally, the thermal characteristics of the cured material are preferably like those of the substrate material (e.g., similar thermal expansion coefficients) and/or the cured material may have a hardness where a cured durometer of the material is less than the durometer of the substrate, and may be substantially less than the substrate (e.g., more than 20% less, more than 30% less, more than 40% less).

The laminate material 26 may be formed of one of an epoxy, silicone, polyurethane, thermoplastics, or any suitable flowable and curable material or film. At least in one embodiment, a material available from Multi-Seals, Inc. (Manchester, Conn.) under the trade designation Poly-Form F08 may be used.

At least in one or more embodiments, the laminate material 26 is a material (e.g., a sheet of laminate material) that exists in a dry and solid normal state at ambient conditions. However, when treated (e.g., thermally treated) the material flows (e.g., with or without pressure being applied). During and/or after the treatment (e.g., during thermal treatment and/or the heat is removed), the material cures to a cured (e.g., hardened) state. The materials may be materials that may be treated and cured in one step or multiple step processes.

At least in one or more embodiments, the surface energy of the laminate material when thermally treated such that the material flows is low enough to promote wicking (or wetting) of the material up the perimeter surfaces of the first end 44 of the conductive elements 40. However, the surface energy of the laminate material when thermally treated is high enough to prevent it from flowing over the end surface 37 of the conductive elements 40. Such wicking up the surfaces (e.g., side surfaces) of the first end 44 provides the ability of the laminate material 26 when flowed and cured during processing as described herein to form a meniscus (e.g., part of the fillet seal 49) about the perimeter 51 of each conductive element 40 and between an end surface 37 terminating an end 44 of each conductive element 40 and laminate material 165 continuously affixed to the surface 24 of the substrate 20 between the conductive elements 40 as laminate material 26 wicks up a portion of the perimeter 51 of the conductive element 40. In other words, without being bound by theory, it is the wetting property that promotes wicking all the way to the tip edge, but not over the tip or end surface 37. At least in one embodiment, a majority of the perimeter surfaces of the first end are coated, but only the sides and not the end surface 37, thus forming the meniscus.

Again without being bound by theory, for optimum adhesion, a laminate material must thoroughly "wet out" the surface to be bonded. "Wetting out" refers to the material flowing and covering the surface to maximize the contact area and the attractive forces between the material and bonding surfaces. A lower surface energy material will spontaneously wet out a higher energy surface. As such, for example, for the laminate material to "wet out" the surface to which it is to bonded, the surface energy of the flowing laminate material must be as low or lower than the surface energy of the conductive element or portions thereof, such as the perimeter surfaces.

The plurality of openings 30 may be defined through the substrate 20 and the laminate material 26 applied to surface 22 thereof. For example, the openings 30, as shown in FIG. 2A, are defined through substrate 20 from first surface 22 to second surface 24 of substrate 20 by one or more opening surfaces 32 and through the laminate material 26 by one or more opening surfaces 33. In one or more embodiments, the size and shape of the openings 30 may be dependent upon the conductive elements 40 to be mounted therein.

Conductive elements 40 are mounted in each opening 30 defined through the substrate 20. The conductive elements 40 are mounted in the openings 30 using the laminate material 26 as will be described further herein.

Each conductive element 40 extends along an axis 43 and generally includes a main body portion 42 and a tail portion 45 extending therefrom. The tail portion 45 terminates at a first end 44 and a second end 46 terminates the end of the conductive element opposite the first end 44 of the conductive element. At least the first end 44 is, at least in one embodiment, configured for receipt of solder material 52 (e.g., a solder ball, solder sphere, or column) thereon. For example, an end surface 37 terminates the end 44 of the tail portion 45.

Depending on the type of material used to form the conductive elements and the application of the adapter apparatus, at least in one embodiment, solder material may not be needed on the first end of the conductive element 40 (e.g., a gold first end that can be otherwise soldered to the target board without the need to prevent the first end from oxidation). Preferably, solder material is received on the end surface 37 of the first end 44 of the conductive element 40. In other words, at least in one or more embodiments, the main body portion 42 terminates at the second end 46 opposite of the first end 44 terminating the tail portion 45; the first end 44 terminating the tail portion 45 being accessible for receiving solder material 52 and the second end 46 terminating the main body portion 42 of the conductive element 40 also being accessible (e.g., for connection to other conductive elements) when the at least one conductive element 40 is mounted in the corresponding opening 30.

In one or more embodiments, the main body portion 42 has a diameter sized and configured to be mounted in the opening 30. Further, the tail portion 45 extending therefrom may have a diameter that is smaller than the diameter of the main body portion 42 and terminate in the end surface 37 configured for receipt of solder material 52. Further, the main body portion 42 may include a tapered portion to transition between the diameters of the main body portion 42 and tail portion 45.

Each conductive element 40 is mounted within a corresponding opening 30 of the plurality of openings using the laminate material 26. For example, the laminate material 26 is flowed and cured to form a fillet seal 49 of laminate material 26 about a perimeter 51 of the first end 44 of each conductive element 40 bridging a gap between the conductive element 40 and one or more surfaces 32 defining the opening 30 through the substrate 20 in which the conductive element 40 is mounted. Further, the laminate material 26 (e.g., material 165) is integral with and continuous on the surface 24 of the substrate 20 between the fillet seals 49 formed about the perimeters 51 of the ends 44 of the conductive elements 40. For example, such integral and continuous laminate material 26 on the surface 24 is clearly shown in the region 57 (e.g., material 165) between the first ends 44 of the conductive elements 40. Further, in one or more embodiments, the fillet seals 49 and the laminate material 26 integral and continuous with such fillet seals 49 on the surface 24 is flowed and cured so as to completely block entry of any material (e.g., solder) into the openings 30 (e.g., prevent solder from wicking into the adapter apparatus 10 about the conductive elements 40 mounted therein). In other words, when in a cured state, such laminate material 26 provides for blocking entry of other materials into the opening 30.

Further, for example, in one or more embodiments, the fillet seal 49 may be considered a rounding of the corner (e.g., bridging the gap between the conductive element and one or more surfaces defining the opening 30). Further, for example, in one or more embodiments, the portion of the perimeter 51 of the first end 44 of each conductive element 40 may be contacted with laminate material after flowing and curing a sheet of laminate material 26 applied to the substrate 20 to form a fillet seal 49 that may include a concave ring of laminate material 26 about the perimeter of the end 44 (e.g., extending radially about the conductive element 40 at the first end 44) bridging the gap between the conductive element 40 and the opening surfaces 32 defined through the substrate 20 in which the conductive element is inserted.

The tail portion 45 extends at least partially within the corresponding opening 30 (e.g., within the opening portion defined by the laminate material 26) and outside of the corresponding opening 30 beyond a surface of the laminate material 26 applied to the surface 24 of the substrate 20 prior to the laminate material 26 being flowed and cured to form the fillet seal 49 of laminate material 26 about the perimeter 51 of the first end 44 of the conductive element 40 bridging the gap between the conductive element 40 and one or surfaces defining the corresponding opening (e.g., the surfaces 32, 33 defining the opening 30 prior to flowed and cured).

The main body portion 42 and tail portion 45 include an outer surface 48. When the conductive element 40 is positioned within an opening 30 of the adapter apparatus 10, the laminate material 26 may be formed between the outer surface 48 of the conductive element 40 and the opening surface or surfaces 32 defining opening 30 through substrate 20. A portion of the outer surface 48 of the conductive element 40 is contacted with the laminate material 26 applied to the surface 24 of the substrate 20 when flowed and cured to form the fillet seals 49. The flowable laminate material 26 locks or stakes the conductive elements 40 in place in the openings 30 and relative to the substrate 20.

In one or more embodiments, barbs or other holding structure 93 may be used to hold or partially hold the conductive elements 40 in the openings 30 prior to mounting the conductive elements 40 in the openings 30 with the laminate material 26. For example, barbs 93 may project from the outer surfaces 48 of the conductive elements 40 for contact and/or engagement with the opening surfaces 32 (e.g., such as when the conductive elements 40 are press fit in the openings 30).

The conductive elements 40, as shown in FIG. 2A, include female socket pins 41 mounted in corresponding openings 30 defined through substrate 20 and the laminate material 26. However, the conductive elements may include any type of terminal configuration. For example, in a manner similar to that shown in FIG. 1B of U.S. Pat. No. 8,091,222 to Fedde et al., issued 10 Jan. 2012, entitled "Method for Forming an Adapter Apparatus Using Curable Material, the conductive element may include a female socket pin (e.g., like female socket pin 41 that shown herein in FIG. 2A), or may include a male terminal pin. In addition, the conductive element may even include a conductive element that has first and second ends configured to receive solder material on at least one or both of the ends (e.g., solder balls on both ends, solder ball on one end and solder film on another, etc.). For example, the conductive element may be a conductive plug (i.e., an element that does not include either a female contact or a male contact at either end) that has solders balls attached to respective ends thereof. However, the conductive element may have other solder materials provided thereon, or may not require any solder material on the ends at all. In other words, the type of conductive element mounted using a laminate material according to the present disclosure may depend upon the particular application to be accomplished with the adapter apparatus.

For example, as shown in FIG. 2B and not to be considered limiting to the present disclosure, the adapter apparatus 10 is employed as a BGA surface mount emulator foot adapter to mount a packaged device 70 (e.g., a BGA package) to target board 12. Target board 12 includes a pattern of contact elements 14 corresponding to a plurality of solder balls 72 of the ball grid array device 70. The solder balls 72 are provided on a pattern of contact pads 74 of the ball grid array device 70.

Further, as shown in FIG. 2B, a pin adapter 80 is provided for use in mounting the ball grid array device 70 to the target board 12 using adapter apparatus 10. The pin adapter 80 includes a substrate 82 with a plurality of male terminal pins 81 mounted therethrough. Each of the male terminal pins 81 includes a pin portion 84 configured to be received in a female socket pin 40 of adapter apparatus 10 and a contact portion 86 for mating with a solder ball 72 of the BGA device 70.

In other words, as the adapter apparatus 10 includes female socket pins 40, a male pin adapter 80 is used to mount the BGA device 70. However, if the adapter apparatus 10 included a plurality of male terminal pins, a female adapter (not shown) may be employed to mount the BGA device as opposed to the male pin adapter 80.

It will be recognized that any number of adapters that include conductive elements mounted through openings formed in a substrate may be mounted using a laminate material and/or one or more processes as described herein. For example, pin adapter 80 may include male terminal pins 81 mounted using the laminate material such as described herein. One skilled in the art will recognize that the use of laminate material to mount conductive elements of an adapter apparatus is not limited to only the embodiments provided herein, but is applicable to any adapter apparatus that may benefit therefrom.

The conductive elements 40, as generally shown in FIG. 2A, as well as any other conductive elements which may be mounted, may be formed of any suitable conductive material. For example, such conductive elements may be formed of brass alloy, gold, nickel, beryllium, or copper alloy. Yet further, various types of contact structures may be employed, as well as various different material types for such contact structures as would be known in the art.

Solder material 52 may include any suitable type of solder material generally known in the art. Such suitability will generally depend on the application for which the adapter apparatus is being used. For example, the solder material 52 may include solder balls as shown in FIG. 2A, solder films, solder spheres, partial solder spheres, solder columns, or any other suitable size and shape of material. Further, for example, the solder material may include eutectic 63/37 SnPb solder balls or solder spheres, or may be formed of lead free solder alloys such as SAC305 (Sn,Ag3.0,Cu0.5).

Figure 3:
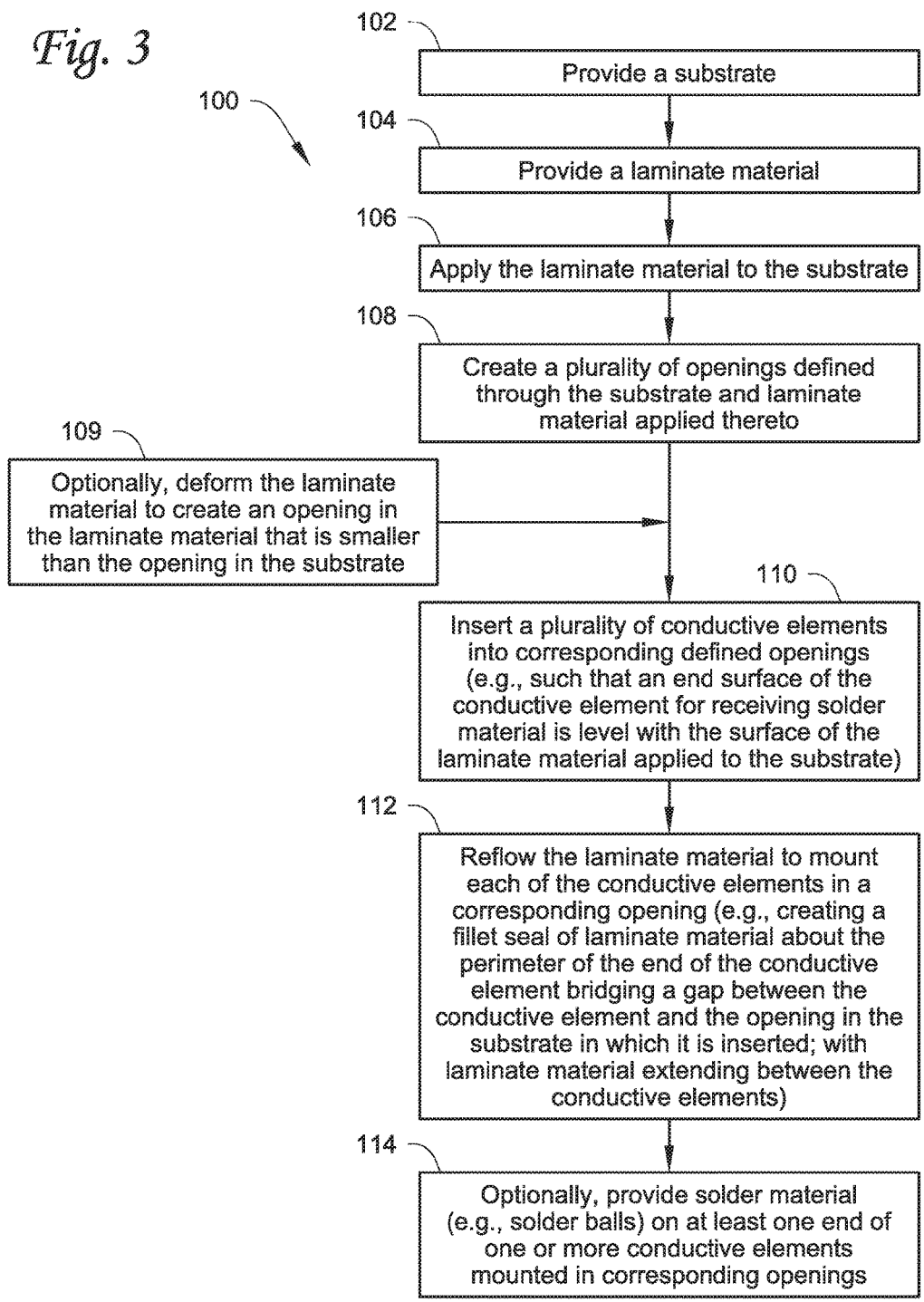
FIG. 3 is a block diagram showing one or more embodiments of a method for providing an adapter apparatus such as that shown generally in FIGS. 1A-1E and 2A-2B.
Figure 4A:
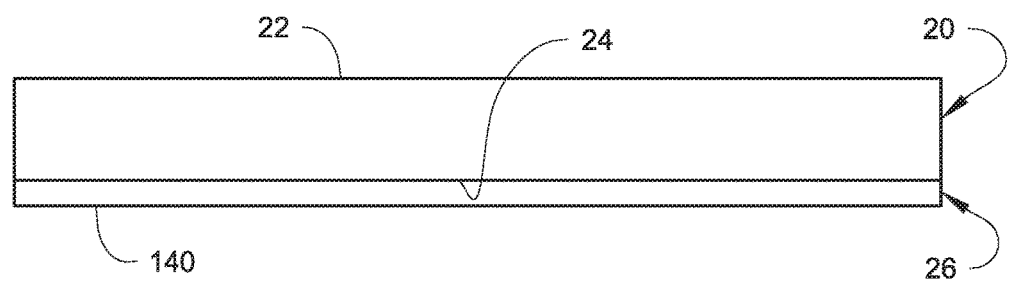

FIG. 3 provides a block diagram of one or more embodiments of a method 100 for providing an adapter apparatus 10 such as that shown generally in FIGS. 1 and 2. For example, the method 100 may include providing the substrate 20 (block 102), providing a laminate material 26 (block 104), and applying the laminate material 26 to the substrate 20 (block 106); resulting in a substrate 20 having laminate material 26 applied thereto as shown in FIG. 4A. However, such a substrate 20 having the laminate material 26 applied thereto as shown in FIG. 4A may be provided in such an applied configuration as opposed to one having to laminate or apply the laminate material 26 onto the surface 24 of the substrate 20. The resulting structure provides an exposed surface 140 of the sheet of laminate material 26 opposite the surface 22 of substrate 20. In one or more embodiments, the exposed surface 140 and the surface 22 and/or 24 are planar and parallel to one another.

In one or more embodiments, the laminate material 26 may be provided as a dry solid sheet of laminate material and then applied to the surface 24 of the substrate 20 using one or more treatments suitable to affix the sheet of laminate material 26 onto the surface 24 (e.g., affix the sheet onto surface 24 of the substrate 20 by lamination). For example, the laminate sheet 26 may have a thickness in the range of about 0.005 inches to about 0.025 inches, and the substrate 20 may have a thickness in the range of about 0.040 inches to about 0.100 inches. However, other thicknesses of such laminate material and substrates may be used.

For example, in one or more embodiments, heat and pressure may be used to affix the sheet of laminate material 26 to the surface 24 of the substrate 20. For example, thermal treatment at a temperature in the range of about 50 degrees C. to about 80 degrees C., and pressure treatment in the range of about 10 psi to about 100 psi (e.g., such as with use of a roller) may be used to affix the sheet of laminate material 26 to the surface 24. However, one will recognize that the type of thermal and pressure treatment will depend upon the characteristics or composition of the sheet of laminate material 26 and the substrate to which it is applied.

Further, for example, in one or more embodiments, a solvent and a roller may be used to affix the sheet of laminate material 26 to the surface 24 of the substrate 20. For example, solvents such as alcohol, acetone, or the like, and pressure treatment using a roller in the range of about 5 psi to about 50 psi may be used to affix the sheet of laminate material 26 to the surface 24. However, one will recognize that the type of solvent and pressure treatment will depend upon the characteristics or composition of the sheet of laminate material 26 and the substrate to which it is applied.

With the provision of the resultant substrate 20 having the sheet of laminate material 26 applied thereto as shown in FIG. 4A, a plurality of openings 30 may be defined through the substrate 20 and the sheet of laminate material 26 applied thereto (block 108). For example, each of the plurality of the openings 30 may be configured to receive one of a plurality of conductive elements 40 (e.g., each of the plurality of conductive elements 40 may include the end 44 terminating in end surface 37 configured to receive solder material thereon).

Figure 4B:
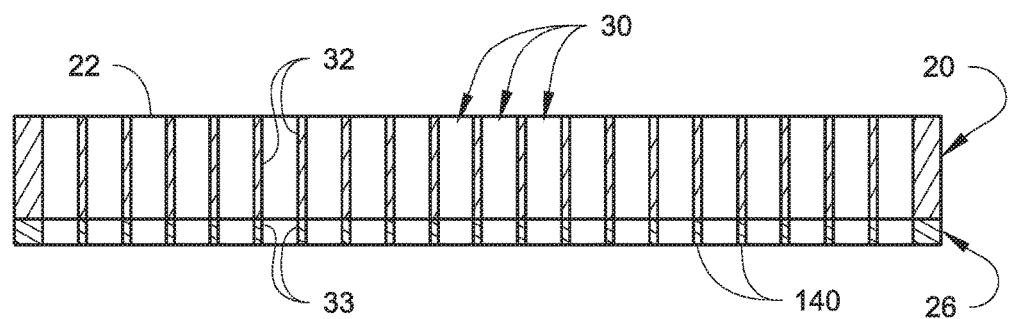

Any suitable apparatus for defining such openings 30 may be used (e.g., chemical etching processes, via formation processes, laser drilling, mechanical material removal processes such as drilling, etc.). For example, at least in one or more embodiments, the openings 30 provided in the substrate 20 having the sheet of laminate material applied thereto may be formed by drilling holes through the substrate 20 and through the sheet of laminate material 26 (e.g., through substrate surface 22 and through exposed surface 140) as shown in FIG. 4B. In one or more embodiments, definition of each of the plurality of openings 30 through the substrate 20 and the sheet of laminate material 26 applied thereto include creating a substrate opening formed by substrate surfaces 32 defined through the substrate 20 having a substrate opening diameter 152 and creating a laminate sheet opening formed by substrate surfaces 33 defined through the laminate sheet 26 applied to the substrate 20 having a laminate opening diameter 153 (see FIG. 4C).

For example, at least in one embodiment, the drill size for forming the opening (e.g., holes) may be equal to or up to 0.0005 inches smaller than the largest feature of conductive element 40 that is to be inserted into the opening 30. In one embodiment, the holes are of a single diameter completely from the surface 22 to the exposed surface 140. For example, the diameter of the opening 30 may be slightly smaller than the largest cross sectional diameter of the main body portion 42 of the conductive element 40 inserted into the opening 30. For example, the pin may be press fit into the opening 30. As such, for example, the hole diameters may be smaller than the largest feature of the conductive element (e.g., pin) to provide an interference fit which may be the barb 93 on the outer surface 48 of the conductive element 40 in contact with the opening surface 32.

Figure 4D:
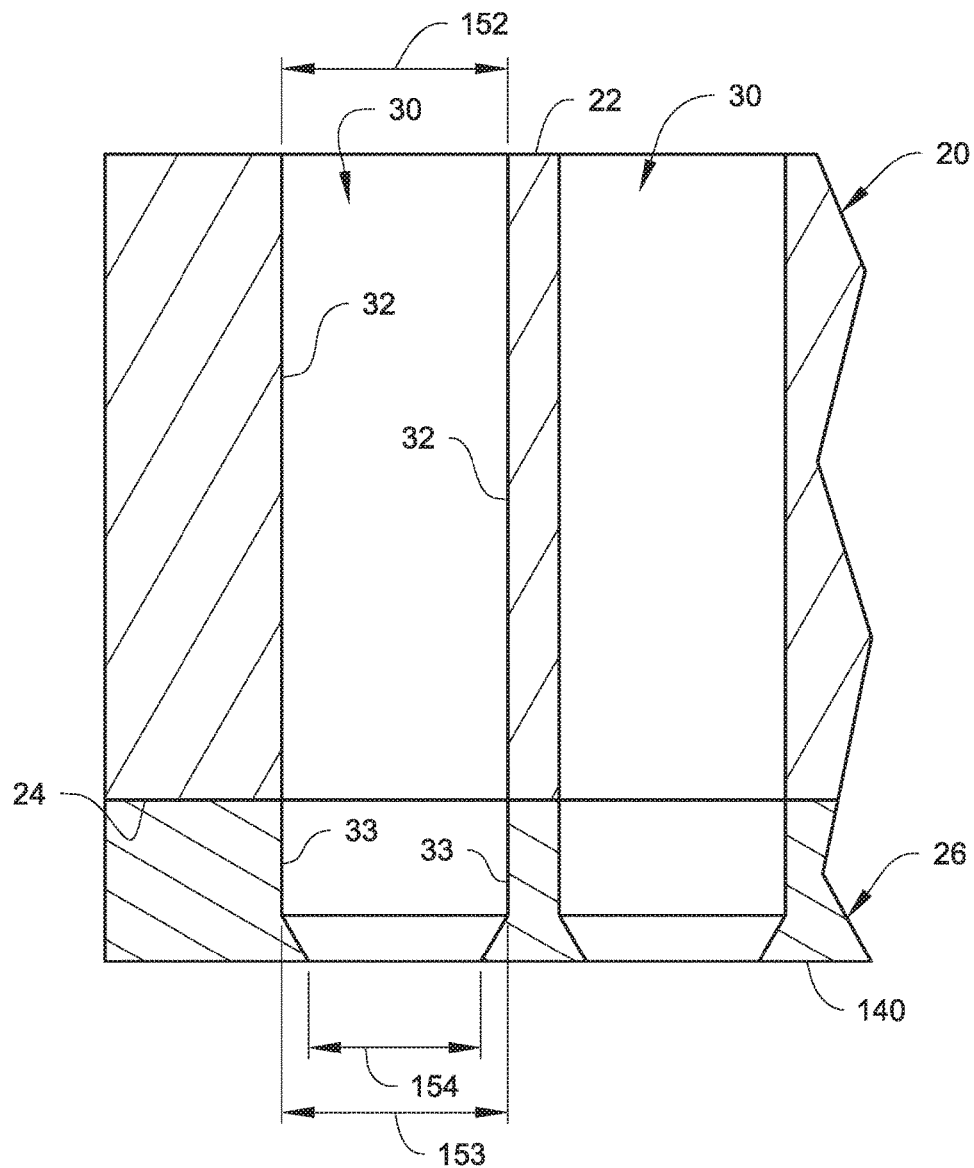

To more clearly describe the one or more embodiments of method 100, FIGS. 4C-4G show only a portion of the resultant substrate 20 having the sheet of laminate material 26 applied thereto. These FIGS. 4C-4G will be described with respect to the mounting of only one conductive element 40 in one opening 30 defined therein. For example, two openings 30 are shown in FIGS. 4C-4D but FIGS. 4E-4G include only one conductive element 40 mounted in only one of such openings 30. One will recognize that any of the other conductive elements 40 may be mounted in the same or similar manner.

Optionally, and either prior to or after insertion of conductive elements 40 into the defined openings 30 (block 110), a size of at least a portion of the laminate sheet opening may be decreased (e.g., the size of the opening may be made smaller) such that the laminate opening diameter of at least a portion of the laminate sheet opening defined by surfaces 33 is decreased from the diameter 153 to less than the substrate opening diameter 152 of the substrate opening defined by surfaces 32 as shown in FIG. 4D (block 109). Such a decrease in the size of the diameter of at least a portion of the laminate opening defined by surfaces 33 from the laminate opening diameter 153 to the decreased laminate opening diameter 154 may be implemented using any number of processes, such as chemical processing, thermal treatment, pressure treatment, etc.

For example, in one or more embodiments, a decrease in diameter may be accomplished by deforming the laminate sheet 26 applied to the surface 24 of the substrate 20 with the laminate sheet openings defined therein to decrease the size of at least a portion of the laminate sheet openings such that the laminate opening diameter 154 of a portion of the laminate sheet openings are less than the substrate opening diameter 152 of the substrate openings. Such a deformation may include applying heat and pressure to the laminate sheet to decrease the size of at least a portion of the laminate sheet openings.

For example, thermal treatment at a temperature in the range of about 30 degrees C. to about 80 degrees C., and/or pressure treatment (e.g., such as with use of a roller) in the range of about 5 psi to about 80 psi, may be used to deform the exposed surface 140 of the sheet of laminate material 26 to create the decreased diameter 154 of the laminate sheet openings. However, one will recognize that the type of thermal and pressure treatment will depend upon the characteristics or composition of the sheet of laminate material 26. Reducing the diameter of the laminate sheet opening may be used to force the laminate material 26 into intimate (e.g., direct contact) with the surfaces of the conductive elements 40 (e.g., perimeter surfaces 51 of the end 44 of the conductive element 40) to promote flow and wicking during the mounting process.

Following the formation of the openings 30 as desired, the method 100 further includes inserting the plurality of conductive elements into corresponding defined openings 30 (block 110). For example, the insertion of each conductive element may include inserting the conductive element 40 into the corresponding defined opening 30 such that at least a portion of the tail portion 45 is within the laminate sheet opening defined by laminate opening surfaces 33.

At least in one or more embodiments, inserting each of the plurality of conductive elements 40 into a corresponding opening of the plurality of the openings 30 includes inserting each of the plurality of conductive elements 40 into a corresponding opening of the plurality of the openings 30 such that the end surface 37 terminating the end 44 of the conductive element 40 is outside of the corresponding opening beyond the exposed surface 140 of the sheet of laminate material 26. In other words, the tail portion 45 of the conductive element 40 is inserted through the substrate opening defined by surfaces 32 of the substrate 20 and then through the laminate opening defined by surfaces 33 of the sheet of laminate material 26 with the end surface 37 extending beyond the exposed surface 140 of the sheet of laminate material 26 (e.g., the conductive elements 40 may be press fit in the openings 30). Any suitable insertion technique may be used, such as with use of jigs, etc.

Figure 4E:
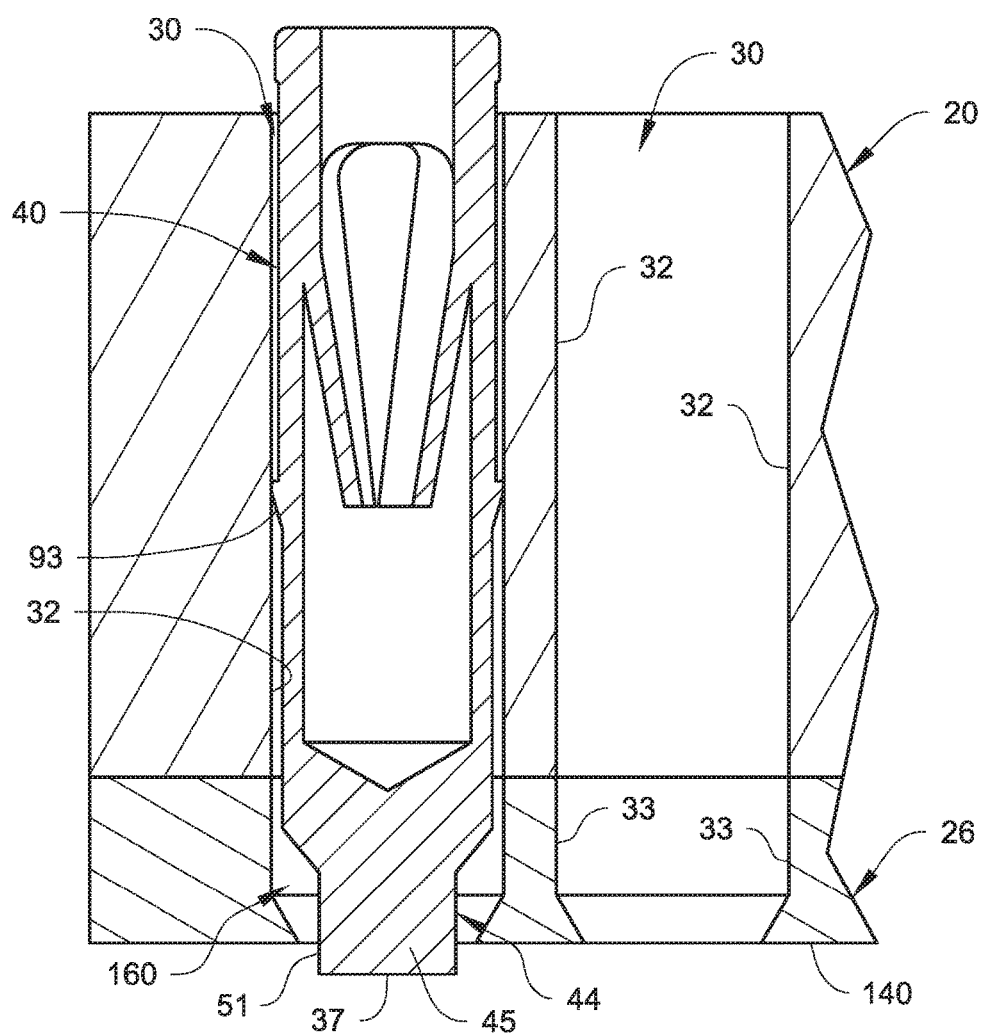
Figure 4F:
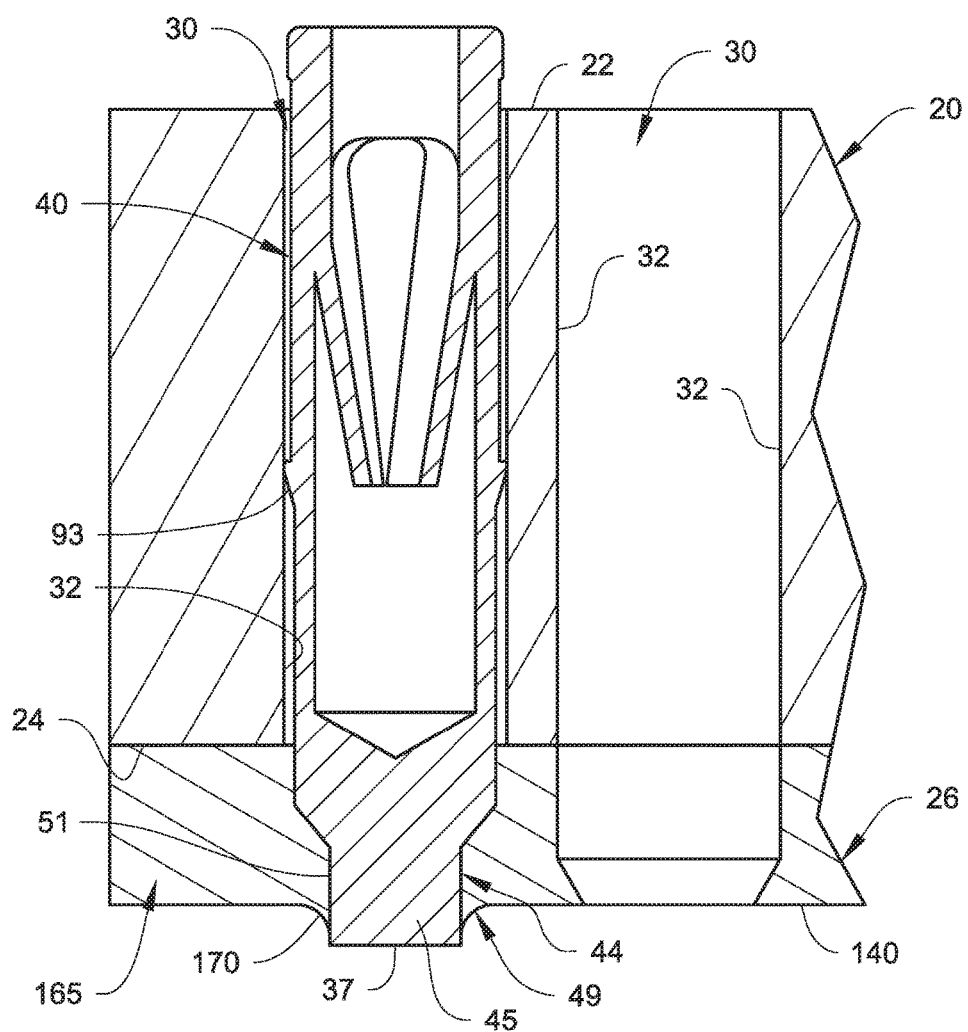
Figure 4G:
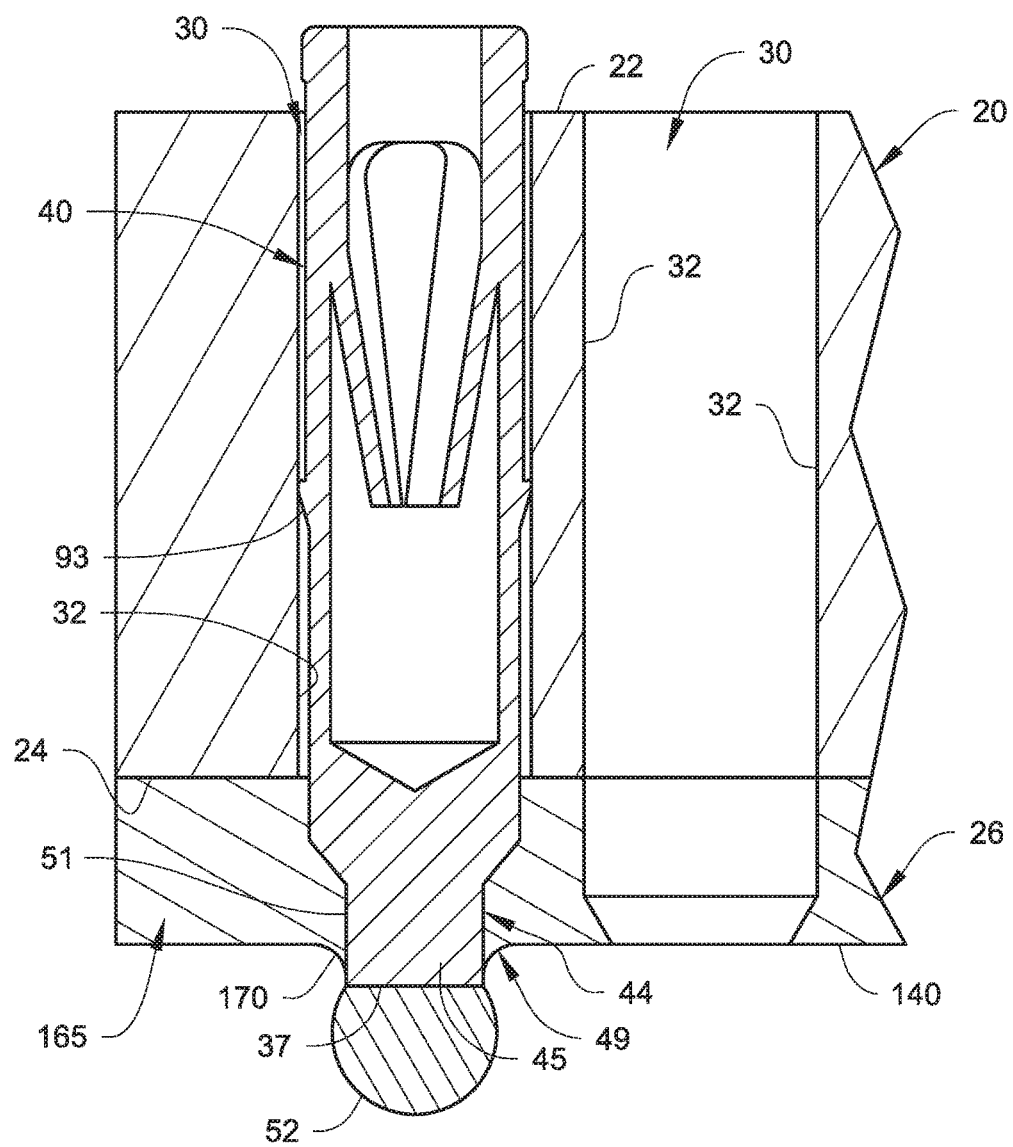

With the plurality of conductive elements 40 inserted into the corresponding defined openings or holes 30 (block 110), each of the conductive elements 40 is then mounted in a corresponding opening 30 using the laminate material 26 (e.g., locked or staked into place by the flow and curing of the sheet of laminate material 26) (block 112) as shown in FIG. 4F. Thereafter, in one or more embodiments, solder material (e.g., solder balls 52) may be provided on at least the end surface 37 of the first end 44 of each conductive element 40 mounted in corresponding openings 30 as shown in FIG. 4G.

In at least one or more embodiments, upon treatment, the flowing and curing of the sheet of laminate material 26 form a seal 49 (e.g., including fillet seal) of laminate material 26 about a perimeter 51 of the end 44 of each conductive element 40 (e.g., tail portion 45) bridging a gap 160 between the conductive element 40 and one or more surfaces (e.g., surfaces 32) defining the opening 30 through the substrate 20 in which the conductive element 40 is inserted. For example, the gap 160 is best shown in FIG. 4E prior to the flowing and curing of the sheet of laminate material 26.

In one or more embodiments, the flowing and curing of the sheet of laminate material 26 to form the seal 49 of laminate material 26 about the perimeter 51 of the end 44 of each conductive element 40 may include forming a meniscus 170 between the end surface 37 terminating the end 44 of each conductive element 40 and laminate material 165 integral and continuous with the seal 49 and affixed to the surface 24 of the substrate 20 between the conductive elements 40 (e.g., such as in the region 57 shown in FIG. 2A). In one or more embodiments, the laminate material 26 may flow into the gap 160 to seal the opening 30.

For example, one will recognize that the laminate material 26 may entirely fill the gap 160 defined between the outer surface 48 of the conductive element 40 and the one or more opening surfaces defining opening 30, or may only partially fill the gap 160. At least in one embodiment, the laminate material 26 when flowed and cured, substantially blocks any foreign material from entering into the corresponding opening 30. For example, when the solder material 52 (e.g., solder balls) is reflowed for coupling onto the first ends 44 of the conductive elements 40, solder is prevented from entering the openings 30.

Further, in one or more embodiments, the meniscus 170 (e.g., part of fillet seal 49 between the end surface 37 terminating the end 44 of each conductive element 40 and laminate material 165 integral and continuous with the seal 49 and affixed to the surface 24 of the substrate 20 between the conductive elements 40) is formed as the laminate material 26 flows and wicks up the perimeter 51 of tail portion 45 of the conductive element 40 outside of the corresponding opening beyond the exposed surface 140 of the sheet of laminate material 26.

In one or more embodiments, for example, flowing and curing the dry flowable sheet of laminate material 26 forms a meniscus 170 (e.g., as well as the entire fillet seal 49) about the perimeter 51 of each conductive element 40 and between the end surface 37 terminating an end 44 of each conductive element 40 and the laminate material 165 integral and continuous with the seal 49 affixed to the surface 24 of the substrate 20 between the conductive elements 40. The meniscus 170 is formed as laminate material 26 wicks up the portion (e.g., perimeter portion 51 of tail portion 45) of the conductive element 40 outside of the corresponding opening 30 beyond the exposed surface 140 of the sheet of laminate material 26. For example, as described herein, the surface energy of the laminate material 26 when thermally treated may be low enough to promote wicking (or wetting) of the material 26 up the perimeter surface 51 of the first end 44 of the conductive elements 40. However, the surface energy of the laminate material 26 when thermally treated may be high enough to prevent it from flowing over the end surface 37 of the conductive elements 40.

For example, thermal treatment at a temperature in the range of about 100 degrees C. to about 250 degrees C., or in the range of about 150 degrees C. to about 200 degrees C. may be used to flow the sheet of laminate material 26 to form meniscus 170 (e.g., as well as the entire fillet seal 49) about the perimeter 51 of each conductive element 40 and to form the laminate material 165 on the surface 24 of the substrate 20 between the conductive elements 40. The thermal treatment once removed allows the flowed laminate material 26 to cure in ambient conditions. However, one will recognize that the type of thermal treatment will depend upon the characteristics or composition of the sheet of laminate material 26. In one or more embodiments, a thermal treatment is used to flow and cure the laminate material 26. However, depending on the type of material employed, other curing steps may be alternatively used and/or required in addition to the use of thermal treatment (e.g., ultraviolet light application for a UV curable material, pressure, etc.).

After the flow and curing of the laminate material 26, there is no excess material that needs to be removed to expose the end surfaces 37 of the conductive elements 40 for attachment of solder material 52. Removing such a processing step to expose the end surfaces 37 of the conductive elements 40 prevents damage to the material used for receiving the solder material 52 thereon.

Providing solder material 52 on the first ends 44 (e.g., attachment of solder balls to the end surfaces 37 of the first ends 44) of the conductive elements 40 may be performed by any suitable process. For example, cleaning of the first ends 44 may be performed, solder flux may be applied to the first ends, and thermal treatment may be employed to attach solder balls that are applied to the first ends 44. Further, various types of devices may be used to position solder balls on the end surfaces 37 of the first ends 44, such as, for example, a jig. However, the present disclosure is not limited to any particular application technique for providing the solder material 52 onto the first ends 44 of the conductive elements 40 (e.g., film deposition techniques may be used to apply a solder film, columns may be provided, etc.).

All patents, patent documents, and references cited herein are incorporated in their entirety as if each were incorporated separately. This disclosure has been described with reference to illustrative embodiments and is not meant to be construed in a limiting sense. As described previously, one skilled in the art will recognize that other various illustrative applications may use the techniques as described herein to take advantage of the beneficial characteristics of the apparatus and methods described herein. Various modifications of the illustrative embodiments, as well as additional embodiments of the disclosure, will be apparent to persons skilled in the art upon reference to this description.

What is claimed is:

1. An adapter apparatus comprising:
a substrate having a surface;
a laminate material applied to the surface of the substrate;
a plurality of openings defined through the substrate and the laminate material applied thereto; and
a plurality of conductive elements, wherein each conductive element is mounted within a corresponding opening of the plurality of openings using the laminate material, wherein each conductive element comprise an end configured to receive solder material thereon, wherein the laminate material is flowed and cured to form a fillet seal of laminate material about a perimeter of the end of each conductive element bridging a gap between the conductive element and one or more surfaces defining the opening through the substrate in which the conductive element is mounted.

2. The adapter apparatus of claim 1, wherein the laminate material is integral with and continuous on the surface of the substrate between the fillet seals formed about the perimeters of the ends of the conductive elements.

3. The adapter apparatus of claim 1, wherein at least one of the plurality of conductive elements comprises a main body portion and a tail portion extending therefrom terminating at the end of the conductive element, wherein the tail portion extends at least partially within the corresponding opening and outside of the corresponding opening beyond a surface of the laminate material applied to the surface of the substrate prior to the laminate material being flowed and cured to form the fillet seal of laminate material about the perimeter of the end of the conductive element bridging the gap between the conductive element and one or more surfaces defining the corresponding opening.

4. The adapter apparatus of claim 3, wherein the main body portion terminates at an end opposite of the end terminating the tail portion, wherein the end terminating the tail portion is accessible for receiving solder material and the end terminating the main body portion of the conductive element is accessible when the at least one conductive element is mounted in the corresponding opening, wherein the fillet seal bridging the gap between the conductive element and one or more surfaces defining the corresponding opening through the substrate in which the conductive element is mounted comprises laminate material flowed and cured in a region between the tail portion and one or more surfaces defining the corresponding opening to block entry of other material into the corresponding opening.

5. The adapter apparatus of claim 1, wherein at least one of the plurality of conductive elements comprises a female socket pin, a male terminal pin, or a conductive element comprising two ends configured to receive solder material on at least one of the ends.

6. The adapter apparatus of claim 1, wherein the adapter apparatus further comprises a plurality of solder balls, wherein each solder ball is attached to the end of a corresponding conductive element of the plurality of conductive elements.

7. The adapter apparatus of claim 1, wherein at least one of the plurality of conductive elements comprises an outer surface, wherein a portion of the outer surface is contacted with the laminate material applied to the surface of the substrate when flowed and cured to form the fillet seals.

8. The adapter apparatus of claim 1, wherein the plurality of conductive elements are mounted in the plurality of openings configured to correspond to a contact element pattern of a surface mount device.

9. A method for use in forming an adapter apparatus, wherein the method comprises:
providing a substrate and a sheet of laminate material applied on a surface of the substrate;
defining a plurality of openings through the substrate and the sheet of laminate material applied thereto, wherein each of the plurality of the openings is configured to receive one of a plurality of conductive elements, wherein each of the plurality of conductive elements comprises an end configured to receive solder material thereon;
inserting each of the plurality of conductive elements into a corresponding opening of the plurality of the openings; and
flowing and curing the sheet of laminate material to form a seal of laminate material about a perimeter of the end of each conductive element bridging a gap between the conductive element and one or more surfaces defining the opening through the substrate in which the conductive element is inserted.

10. The method of claim 9, wherein the method further comprises applying heat and pressure to affix the sheet of laminate material to the surface of the substrate.

11. The method of claim 9, wherein the method further comprises using a solvent and a roller to affix the sheet of laminate material to the surface of the substrate.

12. The method of claim 9, wherein defining each of the plurality of openings through the substrate and the sheet of laminate material applied thereto comprises creating a substrate opening through the substrate having a substrate opening diameter and creating a laminate sheet opening through the laminate sheet applied to the substrate having a laminate opening diameter.

13. The method of claim 12, wherein creating a laminate sheet opening through the laminate sheet applied to the substrate comprises decreasing a size of at least a portion of the laminate sheet opening such that the laminate opening diameter of the portion is less than the substrate opening diameter.

14. The method of claim 9, wherein defining each of the plurality of openings through the substrate and the sheet of laminate material applied thereto comprises creating a substrate opening through the substrate having a substrate opening diameter and creating a laminate sheet opening through the laminate sheet applied to the substrate having a laminate opening diameter, wherein the method further comprises:
deforming the laminate sheet applied to the surface of the substrate with the laminate sheet openings defined therein to decrease the size of at least a portion of the laminate sheet openings such that the laminate opening diameter of the portion of the laminate sheet openings are less than the substrate opening diameter of the substrate openings.

15. The method of claim 14, wherein deforming the laminate sheet applied to the surface of the substrate with the laminate sheet openings defined therein to decrease the size of at least a portion of the laminate sheet openings comprises applying heat and pressure to the laminate sheet to decrease the size of the laminate sheet openings.

16. The method of claim 9, wherein applying the sheet of laminate material to the surface of the substrate results in an exposed surface of the sheet of laminate material, and wherein inserting each of the plurality of conductive elements into a corresponding opening of the plurality of the openings comprises inserting each of the plurality of conductive elements into a corresponding opening of the plurality of the openings such that an end surface terminating the end of the conductive element is outside of the corresponding opening beyond the exposed surface of the sheet of laminate material.

17. The method of claim 16, wherein flowing and curing the sheet of laminate material to form a seal of laminate material about a perimeter of the end of each conductive element bridging a gap between the conductive element and one or more surfaces defining the opening through the substrate in which the conductive element is inserted comprises forming a meniscus between the end surface terminating the end of each conductive element and laminate material continuously affixed to the surface of the substrate between the conductive elements.

18. The method of claim 9, wherein each of the plurality of conductive elements comprises a main body portion and a tail portion extending therefrom terminating at the end surface of the conductive element, wherein the tail portion extends at least partially within the corresponding opening and outside of the corresponding opening beyond the exposed surface of the sheet of laminate material, wherein flowing and curing the sheet of laminate material to form a seal of laminate material about a perimeter of the end of each conductive element bridging a gap between the conductive element and one or more surfaces defining the opening through the substrate in which the conductive element is inserted comprises forming a meniscus between the end surface terminating the end of each conductive element and laminate material continuously affixed to the surface of the substrate between the conductive elements as laminate material wicks up the tail portion of the conductive element outside of the corresponding opening beyond the exposed surface of the sheet of laminate material.

19. The method of claim 9, wherein at least one of the plurality of conductive elements comprises an outer surface, wherein a portion of the outer surface is contacted with laminate material after flowing and curing the sheet of laminate material to form a fillet seal of laminate material comprising a concave ring of laminate material bridging a gap between the conductive element and one or more surfaces defining the opening through the substrate in which the conductive element is inserted.

20. The method of claim 9, wherein at least one of the plurality of conductive elements comprises a female socket pin, a male terminal pin, or a conductive plug element.

21. The method of claim 9, wherein the plurality of conductive elements are mounted in the plurality of openings configured to correspond to a contact element pattern of a surface mount device.

22. A method for use in forming an adapter apparatus, wherein the method comprises:
providing a substrate;
providing a dry flowable sheet of laminate material;
affixing the sheet of laminate material to a surface of the substrate resulting in an exposed surface of the sheet of laminate material;
defining a plurality of openings through the substrate and the sheet of laminate material affixed thereto, wherein each of the plurality of the openings is configured to receive one of a plurality of conductive elements;
inserting each of the plurality of conductive elements into a corresponding opening of the plurality of the openings such that a portion of the conductive element and an end surface terminating the end of the conductive element is outside of the corresponding opening beyond the exposed surface of the sheet of laminate material; and
flowing and curing the dry flowable sheet of laminate material to form a meniscus about the perimeter of each conductive element and between an end surface terminating an end of each conductive element and laminate material continuously affixed to the surface of the substrate between the conductive elements as laminate material wicks up the portion of the conductive element outside of the corresponding opening beyond the exposed surface of the sheet of laminate material.

* * * * *